United States Patent
Finarov et al.

(10) Patent No.: US 6,292,265 B1
(45) Date of Patent: Sep. 18, 2001

(54) METHOD AND APPARATUS FOR MONITORING A CHEMICAL MECHANICAL PLANARIZATION PROCESS APPLIED TO METAL-BASED PATTERNED OBJECTS

(75) Inventors: Moshe Finarov, Rehovot; David Scheiner, Ganei Yehuda; Avi Ravid, Kfar Saba, all of (IL)

(73) Assignee: Nova Measuring Instruments Ltd., Rehovot (IL)

( * ) Notice: Subject to any disclaimer, the term of this patent is extended or adjusted under 35 U.S.C. 154(b) by 0 days.

(21) Appl. No.: 09/326,665

(22) Filed: Jun. 7, 1999

(30) Foreign Application Priority Data

Mar. 10, 1999 (IL) .......................................... 128920

(51) Int. Cl.$^7$ .................................................. G01B 11/06
(52) U.S. Cl. ........................... 356/630; 250/559.27; 451/6
(58) Field of Search ...................... 356/381, 382, 356/328, 630, 631, 632; 451/6, 63; 250/559.27, 559.28

(56) References Cited

U.S. PATENT DOCUMENTS

| | | | |
|---|---|---|---|
| 4,899,055 | * 2/1990 | Adams | 356/448 |
| 4,999,508 | * 3/1991 | Hyakumura | 356/382 |
| 5,682,242 | 10/1997 | Eylon . | |
| 5,866,917 | * 2/1999 | Suzuki et al. | 356/381 |
| 5,867,590 | 2/1999 | Eylon . | |
| 5,872,633 | 2/1999 | Holzapfel et al. . | |
| 5,883,720 | * 3/1999 | Akiyama et al. | 356/382 |
| 6,045,433 | * 4/2000 | Dvir et al. | 451/6 |

* cited by examiner

Primary Examiner—Hoa O. Pham
(74) Attorney, Agent, or Firm—Browdy and Neimark

(57) ABSTRACT

A method is presented for optical control of the quality of a process of chemical mechanical planarization (CMP) performed by a polishing tool applied to an article having a patterned area. The article contains a plurality of stacks each formed by a plurality of different layers, thereby defining a pattern in the form of spaced-apart metal regions. The method is capable of locating at least one of residues, erosion and dishing conditions on the article. At least one predetermined site on the article is selected for control. This at least one predetermined site is illuminated, and spectral characteristics of light components reflected from this location are detected. Data representative of the detected light components is analyzed for determining at least one parameter of the article within the at least one illuminated site.

13 Claims, 11 Drawing Sheets

US 6,292,265 B1

METHOD AND APPARATUS FOR MONITORING A CHEMICAL MECHANICAL PLANARIZATION PROCESS APPLIED TO METAL-BASED PATTERNED OBJECTS

FIELD OF THE INVENTION

This invention is in the field of optical monitoring techniques, and relates to a method and system for monitoring a process of chemical mechanical planarization (CMP) applied to metal-based patterned articles. The invention is particularly useful in the manufacture of semiconductor devices.

BACKGROUND OF THE INVENTION

In the manufacture of semiconductor devices, aluminum has been used almost exclusively as the main material for interconnects. However, recent developments in this field of the art have shown that copper is posed to take over as the main on-chip conductor for all types of integrated circuits. Compared to aluminum, copper has a lower resistance, namely less than 2 $\mu\Omega$-cm, even when deposited in narrow trenches, versus more than 3 $\mu\Omega$-cm for aluminum alloys. This lower resistance is critically important in high-performance microprocessors and fast static RAMs, since it enables signals to move faster by reducing the so-called "Resistance-Capacitance" (RC) time delay. Additionally, copper has a superior resistance to electromigration, which leads to lower manufacturing costs as compared to aluminum-based structures.

During the manufacture of semiconductor devices, a wafer undergoes a sequence of photolithography-etching steps to produce a plurality of patterned layers (stacks). Then, depending on the specific layers or production process, the uppermost layer of the wafer may or may not undergo a CMP process to provide a smooth surface of this layer.

FIG. 1 illustrates the cross section of one possible example of a stack-like wafer structure 1 having aluminums interconnects. A silicon layer 2 serves as a substrate on which the stack is produced by sequentially depositing additional layers. A first layer 4 of silicon oxide, a so-called "Interlayer Dielectric (ILD) insulating layer", is deposited on the substrate 2, and aluminum interconnects 6 are formed on the layer 4 by the deposition, photolithography and etching processes. Spaces between the interconnects 6 are filled with a further ILD layer 8. Tungsten (or other metal) vias 10 are produced above the aluminum interconnects 6 by the photolithography and deposition processes, and are aimed at connecting the lower is aluminum layer 6 (line) with an upper one 12. The aluminum layer 12 is then patterned to form the required connections. Prior to depositing the upper aluminum layer 12, a CMP process is applied to the ILD layer 8 to flatten its upper surface. Hence, the upper aluminum layer 12 is almost smooth, and the only local topography existing therein is that caused by dimples 10A in the upper surface of the tungsten 10. As indicated above, all the spaces between the metal features are filled with the Silicon Oxide ILD layer 8 or other dielectric layers.

FIG. 2 illustrates a cross section of a stack-like wafer structure 20 utilizing copper interconnects patterned with a known dual Damascene process. The structure 20 includes a silicon layer (substrate) 22 (whose provision is optional), ILD layers 23A and 23B, and a patterned Silicon Nitride (SiN) layer 24. For a self-aligned via scheme, the SiN layer 24 should be patterned to form vias later on. Thereafter, an ILD layer 26 is deposited on top of the patterned SiN layer 24. Then, patterning (i.e., photolithography) and etching processes are applied to the layer 26 to form trenches therein. During the etching procedure, the layer 26 is removed up to SiN layer 24 within regions 28, while within regions 28A etching continues up to the layer 23B to form vias 29. Those manufacturers who do not use the SiN layer 24 have to conduct a more difficult two-step etching with two photolithography steps on a single thick silicone oxide layer. Further produced is a diffusion tantalum-based barrier layer 30 (or TiN or Ti), whose provision is aimed at preventing copper migration into ILD layers 23A and 23B. Copper is deposited by one of the known techniques, such as CVD, PVD electroplating or electroless plating. If electroplating is used, a thin copper seed layer 32 should be deposited above the diffusion layer 30 as a prerequisite for electroplating. Thus, depending on the deposition process, a so-obtained uppermost copper layer 34 has certain topography.

When manufacturing the aluminum-based structure 1 (FIG. 1), the application of a CMP process to the uppermost aluminum layer 12 is usually not needed. As for the copper-based structure 20 (or tungsten-based structure as well), the manufacturing process requires the use of metal removal. This is true also for processes where aluminum is deposited by the dual Daemascene process.

Copper has properties that add to the polishing difficulties. Unlike tungsten, it is a soft metal and subject to scratching and embedding particles during polishing. Additionally, owing to the fact that copper is highly electrochemically active and does not form a natural protective oxide, it corrodes easily.

With the conventional technology of planarization, ILD polishing occurs after every metal deposition and etch step. The same is not true for damascene processing, wherein the post-polish surface is expected to be free of topography. However, topography is induced because of the erosion of densely packed small features arrays and dishing of the metal surface in large features.

Copper CMP is more complex because of the need completely to remove the tantalum or tantalum nitride barrier layers and copper without the overpolishing of any feature. This is difficult because current copper deposition processes are not as uniform as the oxide deposition process.

The effects of residues, dishing and erosion present defects on the wafer induced by the CMP process applied thereto. Dishing and erosion may deteriorate the interconnections' quality, especially when the copper thickness is reduced. Indeed, the reduction of the copper thickness results in the increase of RC constants, resulting in the slower functioning of the integrated circuit. As indicated above, the lower resistance is critically import in high-performance microprocessors and fast static RAMs.

One of the possible solutions for minimizing the dishing and erosion consists of a tight control of the CMP process. This may, for example, be implemented by means of a compensation strategy using metal fills and dummy structures. However, this is a costly solution in terms of lost silicon for integrated circuits and added process and design complexity. It would be ideal to polish inlaid structures without the aid of such a process and design steps.

U.S. Pat. No. 5,872,633 discloses a method and apparatus for detecting the removal of thin film layers during the planarization. Although a technique presented in this patent is aimed at solving the residues related problem, it is capable of detecting an average thickness of a wafer under planarization, by eliminating information introduced by a pattern. It is thus evident that this technique does not provide precise measurements of the wafer's parameters, and cannot be used for determining the erosion and dishing conditions at all, which conditions, if any, are observed in the pattern area.

SUMMARY OF THE INVENTION

There is accordingly a need in the art to facilitate a CMP process applied to patterned structures such as wafers having metal (e.g., copper) regions, by providing a novel method and system for monitoring the CMP process applied to such structures.

It is a major feature of the present invention to provide such a method which is capable of controlling the CMP process to prevent residues, dishing and erosion effects.

It is a further feature of the present invention to provide such a system which is capable of being integrated with the CMP process applied to wafers progressing along the production line.

The main idea of the present invention is based on the following. An optical monitoring system capable of thickness measurements in patterned structures is applied to selected locations (dies) on an article (wafer) and to predetermined sites within at least some of the selected locations. These predetermined sites are those of potential detrimental effects (i.e., residues, erosion and dishing).

To determine these sites, various methods can be used, based on simulations utilizing the information regarding the wafer's structure and materials, which information is provided by a specific manufacturer, and/or based on a preliminary optical inspection of the wafer. These sites, when having at least some of the detrimental effects of the kind specified above, are characterized by optical properties different from "normal" locations (i.e., free of the detrimental effects).

Having selected the sites of the potential detrimental effects, the optical monitoring system performs accurate thickness measurements, from which parameters (thicknesses) characterizing residues, erosion and dishing effects are derived. The optical system is capable of detecting light components reflected from the site under measurement and producing measured data. Analysis of this measured data utilizes an optical model based on some known features of the wafer's structure and optical factors for producing theoretical data, and includes a fitting procedure of the measured and theoretical data to optimize the model and to calculate the thickness.

There is thus provided according to one aspect of the present invention a method for optical control of the quality of a CMP process applied to an article for determining at least one of residues, erosion and dishing conditions on said article, wherein the article has a patterned area containing a plurality of spaced-apart stacks each formed by a plurality of different layers and thereby defining a pattern in the form of spaced-apart metal regions, the method comprising the steps of:

(a) selecting at least one predetermined site on the article to be controlled;

(b) illuminating said at least one predetermined site;

(c) detecting spectral characteristics of tight components reflected from the at least one illuminated site of the article, and generating data representative thereof; and (d) analyzing said data for determining at least one parameter of the article within said at least one illuminated site.

The at least one site to be selected may be disposed outside the patterned area. In this case, the determined parameter is indicative of the existence of residues of materials to be removed from the article.

Preferably, the at least one predetermined site is selected in the following manner. A preliminary optical inspection is applied to the article to detect light reflected therefrom and to obtain data representative of the detected light. This data is then analyzed to detect sites having optical properties different from other locations on the article. These different optical properties may be defined by a certain range of contrast of the reflected light or certain spectral characteristics of the reflected light. The existence of a pattern having substantially irregular geometry may be indicative of residues.

Preferably, at least two spatially separated sites of the article are illuminated, and data representative of light reflected from these sites are generated. These data are indicative of spectral characteristics of light components reflected from the illuminated sites. By analyzing the generated data, the parameters of the article within the illuminated sites can be determined. The determined parameters are the thicknesses of the article within these two sites.

If one of these sites is selected outside the patterned area, and the other site is selected inside the patterned area of the article, the difference between the thicknesses can be indicative of erosion within the site inside the patterned area. If both locations are located inside the patterned area the difference between the thicknesses may be indicative of pattern dependent dishing and/or erosion condition.

More specifically, the present invention is used for monitoring a CMP process applied to wafers containing copper regions, and is therefore described below with respect to this application.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF A PREFERRED EMBODIMENT

Figure 1:
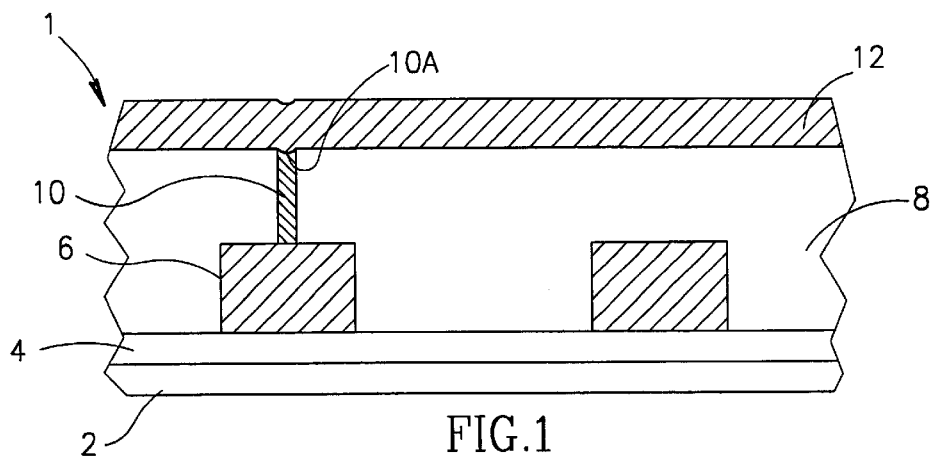
FIGS. 1 and 2 are schematic illustrations of semiconductor wafers having aluminum and copper interconnects, respectively.
Figure 2:
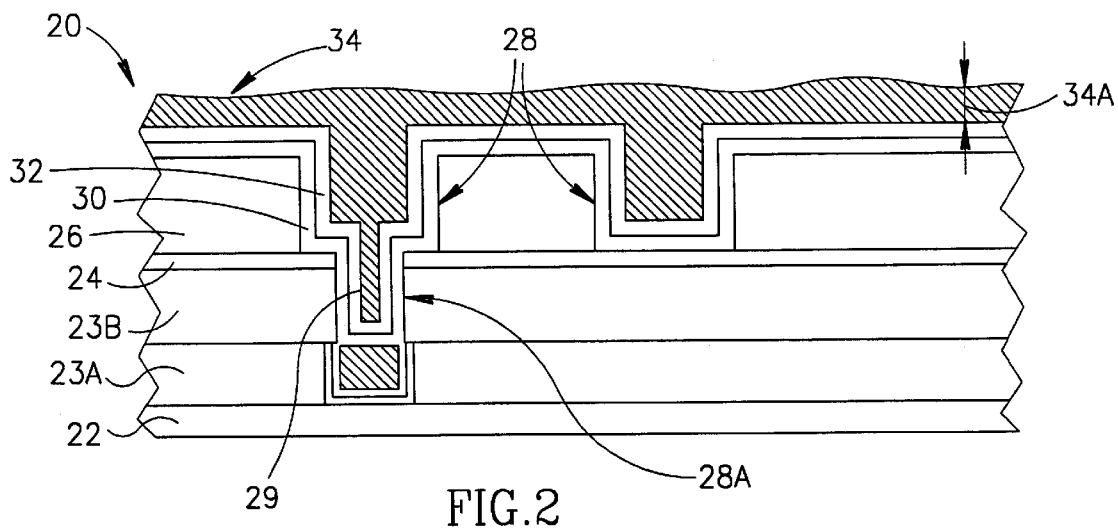

FIGS. 1 and 2 illustrate the wafers' structures 1 and 20 utilizing aluminum- and copper-based interconnects, respectively.

To illustrate clearly the unique features of the present invention, it would be reasonable to consider several CMP-related problems arising when dealing with a copper-based wafer (constituting a structure having a plurality of spaced-apart metal regions).

Referring to FIG. 2, a CMP process applied to the copper-based wafer 20 is aimed at removing an uppermost copper layer portion 34A, so as to provide the smooth surface of the ILD and copper layers 26 and 34. Due to the topography on the wafer's surface, different pressures are created at different locations on the wafer creating different polishing rates at the different locations. Consequentially, "islands" or residues of unpolished layers (e.g., copper layer 34, diffusion barrier layer 30) remain on the surface of the structure 20. Such selective polishing presents a common problem for all kinds of metals, as well as dielectric layers.

As indicated above, the complexity of the "copper" CMP is associated with the need to uniformly remove the cooper layer 34 (34A), diffusion barrier layer 30 and the copper seed layer 32, namely, so as to prevent the overpolishing of any feature. As indicated above, owing to the fact that current copper deposition processes are not as uniform as the oxide deposition processes, such uniformly removal is difficult to perform.

Figure 3:
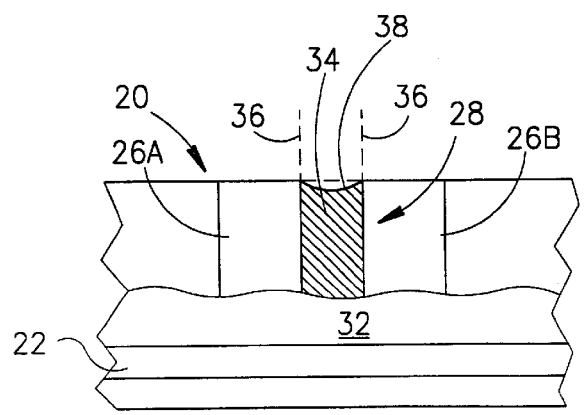
FIG. 3 is a schematic illustration of the uppermost portion of a copper-based wafer under the CMP process, showing more specifically the dishing effect.

Referring to FIG. 3, the upper portion of the structure 20 after CMP process is more specifically illustrated. The copper layer 34 is located within the region 28 enclosed between ILD layer pillars 26A and 26B. Since the ILD layer 26, located under the copper (or tungsten) layer 34 and under the diffusion barrier layer (not shown here), is exposed to the CMP process, small and flexible particles of a polishing pad will selectively continue and polish the copper layer 34 within the region 28.

The above phenomenon is caused by the relatively soft nature of copper (as compared to that of oxide) and chemical nature of the "copper" CMP process. This phenomenon is induced by contact planes 36 (so-called "weakness planes") between the ILD pillars 26A, 26B and the copper layer 34 within the region 28. This is called "dishing", which results in the existence of a copper loss region 38.

Figure 4A:
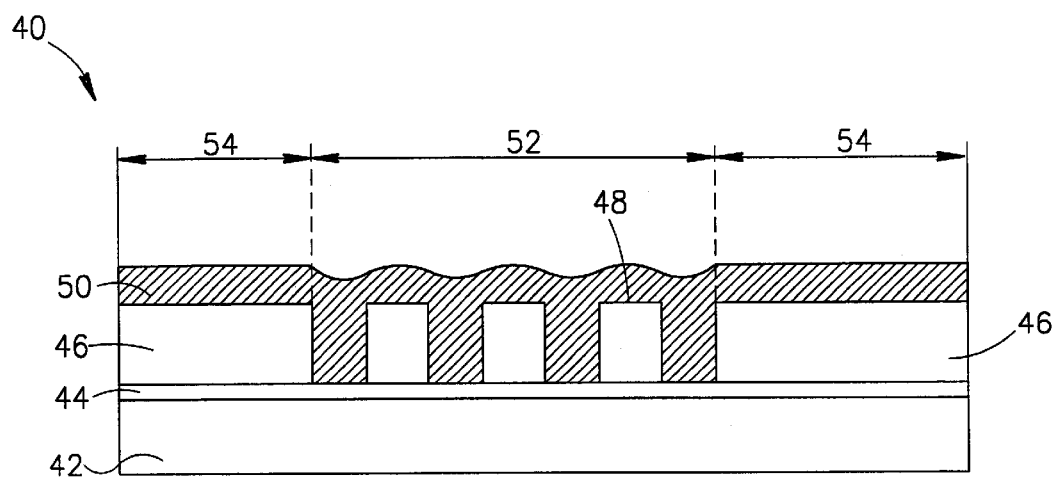
FIGS. 4A and 4B are schematic illustrations of the copper-based wafer prior to and after the application of the CMP process, showing more specifically the erosion effect.
Figure 4B:
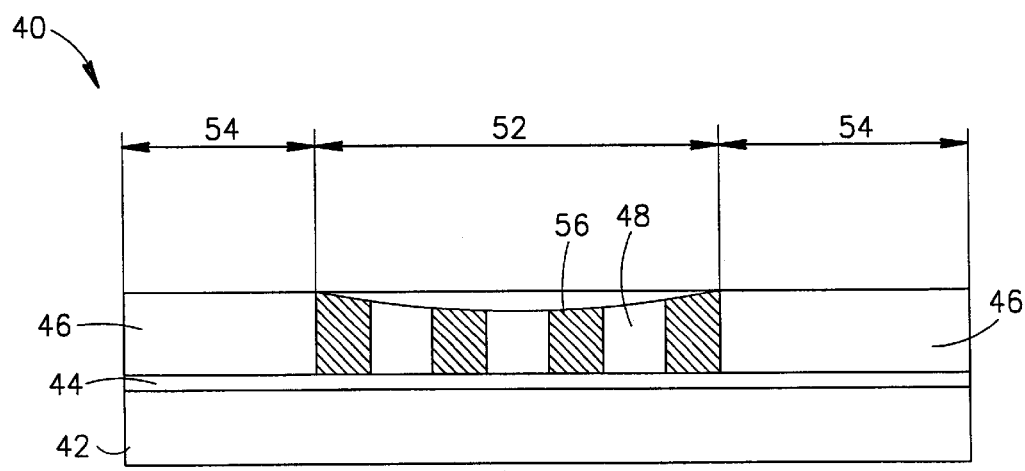

While the copper polishing process proceeds in time, the phenomenon called "erosion" develops. FIGS. 4A and 4B illustrate a stack-like copper-based structure 40 prior to and after the application of a CMP process. The structure 40 includes an ILD layer 42, the so-called "etch stop" layer 44 (e.g., SiN), ILD layer portions 46 and 48, and a copper layer 50. These stack layers define a dense structure 52 (composed of the ILD layer portions 48 and copper layer 50) surrounded by the ILD layer portions 46 in regions 54.

Such a structure 40 imposes a different polishing rate distribution over the regions 52 and 54. Due to the relatively large and harder ILD layer portions 46, as compared to the small features in the dense region 52, the polishing process proceeds quicker above the region 52, than the region 54. The highest localized polishing rate occurs in the middle of the region 52.

As shown in. FIG. 4b, the above results in a bent-like local profile 56 (concave) of the upper surface of the structure 40. The existence of the profile 56 is called "erosion", presenting the direct loss of ILD and metal (e.g., copper) within a region 52.

Figure 5:
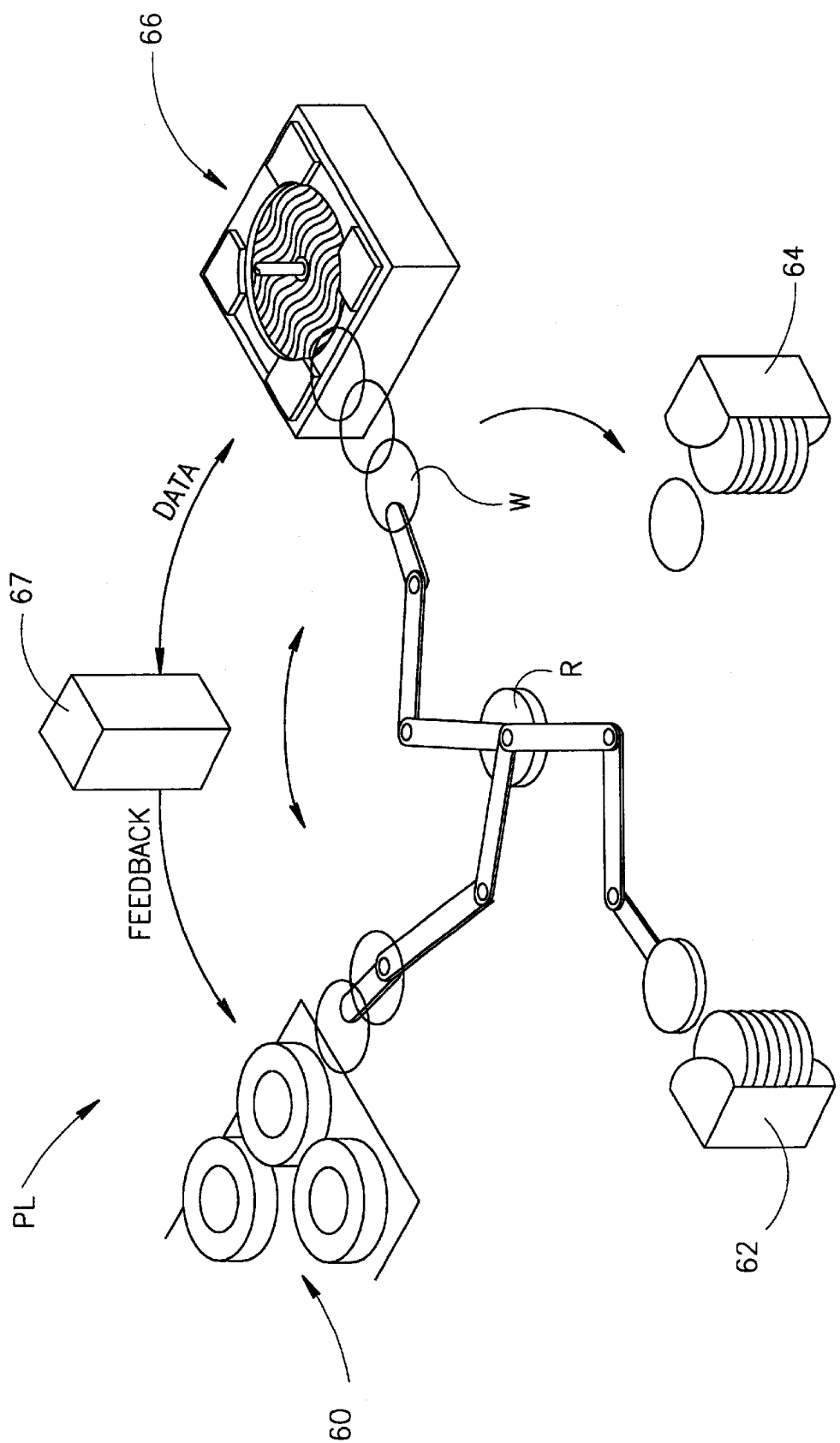
FIG. 5 is a schematic block diagram of a part of the wafers manufacturing production line, utilizing an optical system according to the present invention.

Reference is now made to FIG. 5 illustrating a part of a production line PL for the manufacture of copper-based wafers W constructed and operated according to the invention. The wafer W represents a stack-layer structure similar to the structure 20 shown in FIG. 2. The production line part PL includes a CMP polishing pad 60 (constituting a polishing assembly), loading and unloading cassettes 62 and 64, a robot R and an optical measurement system 66. The robot R conveys wafers between the polishing assembly 60 mid the measurement system 66.

The construction and operation of the CMP polishing assembly 60 are known per se and therefore need not be specifically described. As for the measurement system 66, its construction and operation do not form part of the present invention, and therefore also need not be specifically described and illustrated, except to note the following.

The system 66 includes a microscope-based spectrophotometer capable of measuring the thickness of thin films, and an imaging system typically comprising a CCD camera. The construction and operation of the system may be of any known kind, for example, such as those disclosed in U.S. patent application Ser. No. 08/497,382 assigned to the assignee of the present application. Additionally, in the system 66, light directing and detection assemblies are designed such that only a diffraction zero-order light component of the light returned from the wafer W is is collected to produce measured data. This measured data is indicative of photometric intensities of light of different wavelengths reflected from the wafer W. Optionally, the system 66 could be provided with dynamic auto-focusing assembly enabling high speed measurement. The system 66 is connected to a processor unit 67 which is responsive to the measured data and is capable of analyzing these data. To this end, the processor unit 67 comprises suitable image processing software also including pattern recognition algorithms for both global and site-to-site alignment and translation means so as to locate and process measurements. Measured and analyzed data could be used for establishing a feedback closed-loop control on the CMP process.

The processor unit 67 is pre-programmed by a certain optical model, which is based on at least some features of the structure (wafer). The model is capable of determining theoretical data representative of photometric intensities of light components of different wavelengths specularly reflected from the wafer, and calculating desired parameters (e.g., thickness) of the wafer's layers. One example of the measuring technique that could be utilized in the present invention is disclosed in co-pending U.S. application Ser. No. 09/267,989, assigned to the assignee of the present application, which application is therefore incorporated herein by reference.

In the present example of FIG. 5, the system 66 is an integrated monitoring system installed in the production line PL within a working station occupied by the polishing assembly 60. It should, however, be noted that such a monitoring system. could be a stand-alone unit or an in-situ system (installed in the polishing assembly in such a manner that it can monitor the polished wafer in a real time, i.e., during polishing).

According to the present invention, prior to monitoring the CMP process, a so-called "recipe preparation" is carried out. The main concept underlying the main principles of the recipe preparation will now be described.

Recipe Preparation

The recipe preparation consists of constructing a map of measuring locations (selected dies) and sites within the selected die to which measurements are to be applied during the monitoring procedure. As indicated above, these selected locations and sites therein are areas of potential detrimental effects (residues, erosion or dishing). The selection of these locations/sites is based on the following considerations.

(1) The case may be such that full information on measuring areas is provided by the specific manufacturer, namely locations (dies) on the wafer and sites (features) within the selected location. In this case, there is actually no need for any recipe preparation, and optical monitoring system 66 is applied to the predetermined locations according to the information known from the manufacturer.

(2) It is often the case that sites within a die where the detrimental effects are likely to occur during polishing are known, but dies (locations) containing these sites have to be selected. In other words, so-called "product dependent information is known", while the process variation is not defined.

(3) A manufacturer may define specific locations (dies) on the wafer where the detrimental effects may be expected due to a known profile of deposition and the polishing process (so-called "process dependent information"). In this case, the recipe preparation is aimed at defining measuring sites within these selected dies.

(4) The most general case is such that no information about measuring locations (dies) nor measuring sites within the dies is provided by a manufacturer.

Figure 6A:
FIG. 6A is a schematic illustration of a profile of the wafer's surface after the CMP process.
Figure 6B:
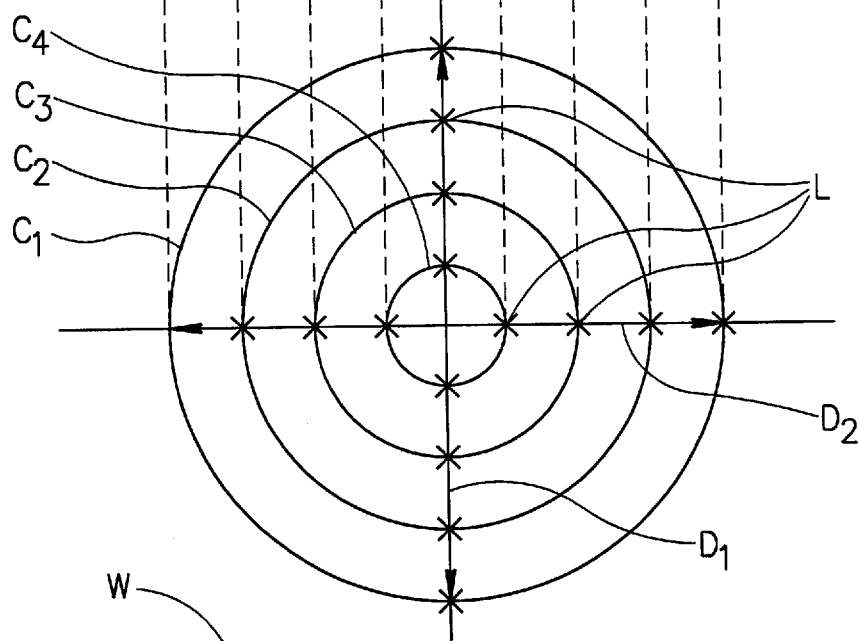
FIGS. 6B and 6C are schematic illustrations of two different maps, respectively, of selective sites on the wafer to which thickness measurements are to be applied.

FIGS. 6A and 6B illustrate how a typical profile of a polished wafer along its diameter may be used for defining the measuring locations (dies). FIG. 6A illustrates a profile P of wafer W that has undergone the CMP process. The profile P represents the distribution of the wafers' thickness H along the wafer's diameter D. This profile P results from both the thin films deposition processes on the wafer surface and CMP process. FIG. 6B illustrates a top view of the wafer W, wherein regions of different thicknesses $H_1$, $H_2$, $H_3$ and $H_4$ are presented by a plurality of concentric circles $C_1$–$C_4$, respectively, with the wafer W. Each circle signs a is different wafer's thickness along the surface profile P. The measuring locations (i.e., dies) L on the wafer's surface are selected in a manner to include at least one location from each circle. The locations L are selected at the intersections of the wafer's diameters $D_1$ and $D_2$ with the circles $C_1$–$C_4$. The number of locations L to which measurements are to be applied is determined according to the required resolution along the profile P.

Figure 6C:
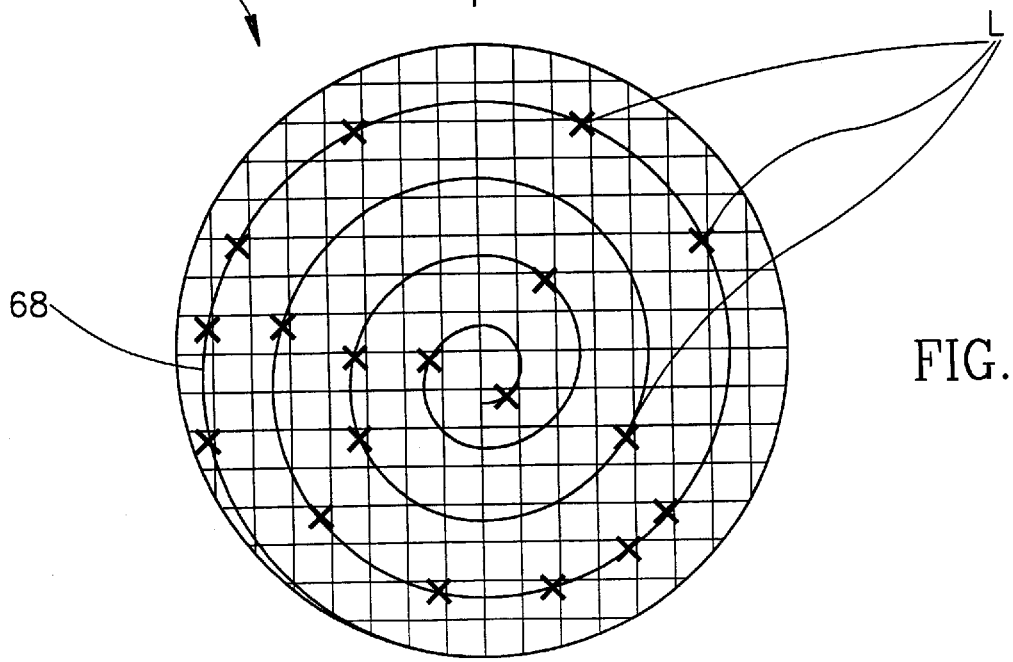

Alternatively, as illustrated in FIG. 6C, the measuring locations (dies) L can be selected in a manner to be uniformly distributed on the wafer. The selected measuring locations L are located in a spaced-apart relationship along a helical path 68 on the wafer's surface, on which dies are arranged in a so-called "streets-and avenues" manner.

It should be noted that measuring sites/locations should be determined separately for residues and erosion/dishing effects.

Residues

Following are the main operational steps in the recipe preparation process for selecting "suspicious" locations for residues.

Step A: An under-polished wafer provided by a specific manufacturer may be inspected either visually (manually) or by performing a mask-independent inspection of the entire wafer using an internal or external Low Resolution Optical Inspection System of any known type. With regard to the visual inspection, it may be based on the fact that residues can be identified due to their incorrect shape, a so-called "puddle", and due to their more matte surface, as compared to the, other features in the wafer.

As for the optical inspection of the under-polished wafer, it is based on the fact that, if no erosion occurs in specific locations on the under-polished wafer, there definitely will be no erosion in these specific locations on the normally polished wafer. Thus, detected residues-free locations on the under-polished wafer no longer need to be monitored. Conisequently, locations to be monitored are other than these detected locations, the monitoring process being aimed at controlling the under-polished edge of the polish process window. Additionally, residues are characterized by reduced contrast in an acquired image of a patterned area (as compared to the other features). Also die-to-die or die-to-many-dies technique utilizing comparison with resides-free dies could be used for detecting residues-containing areas. Inspection is carried out to find dies with limited residues (so-called "flakes"). Sites on these dies containing residues are recorded as measuring (monitoring) sites for the edge of the process window. Hence, during the recipe preparation, images of typical residue prone sites can be stored in the processing unit as reference data.

Figure 7A:
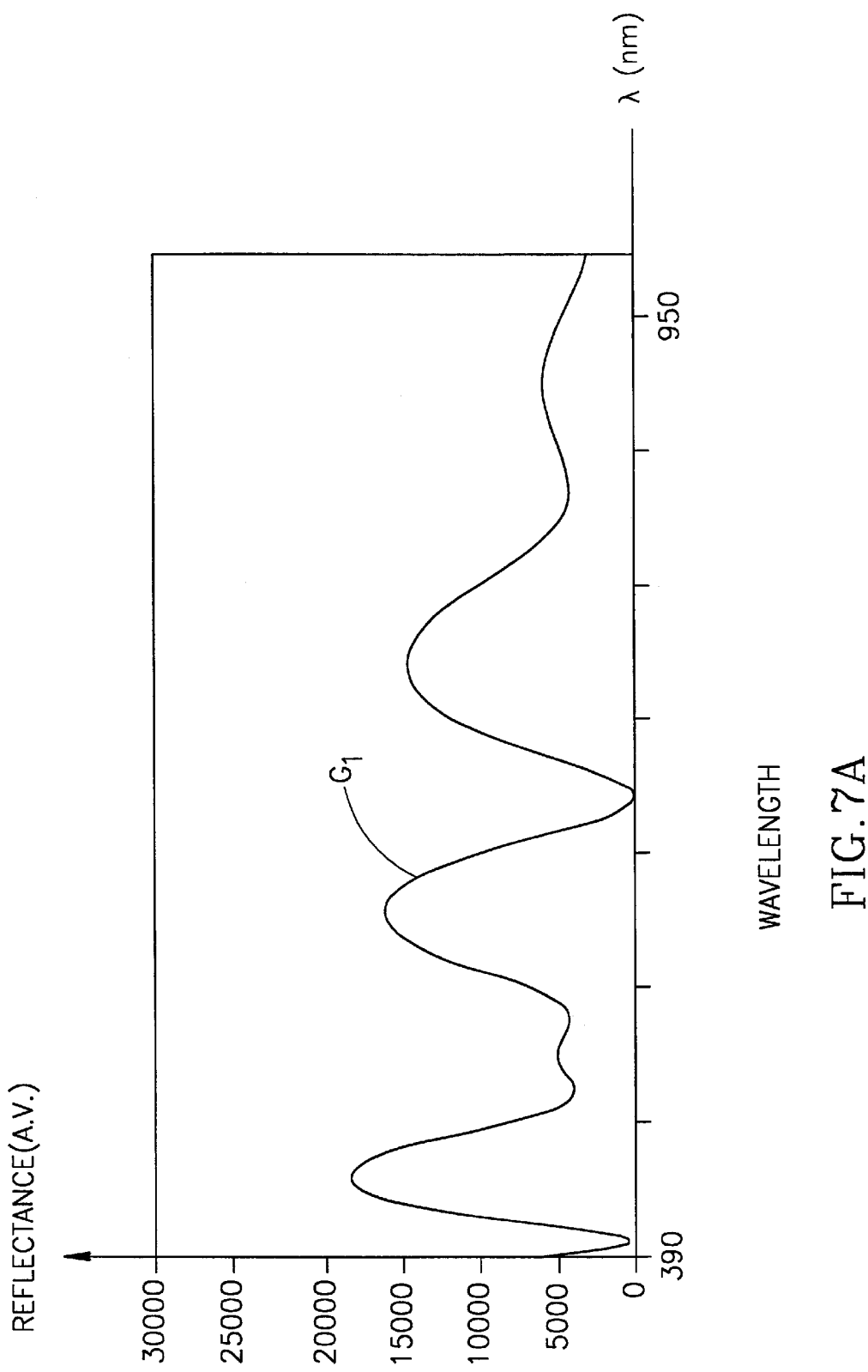
FIGS. 7A to 7C graphically illustrate the residues-related effect resulting from the CMP process.
Figure 7B:
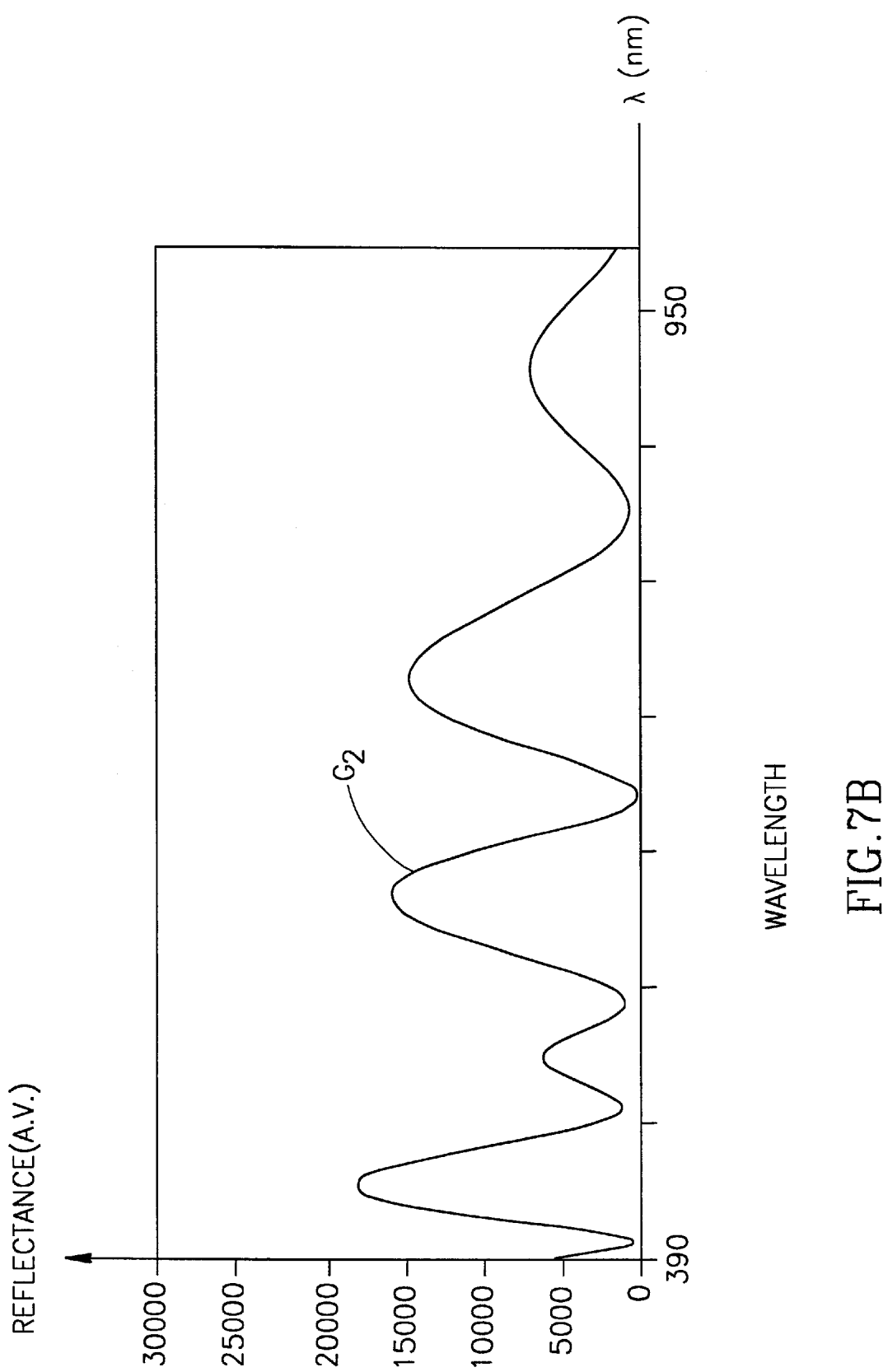
Figure 7C:
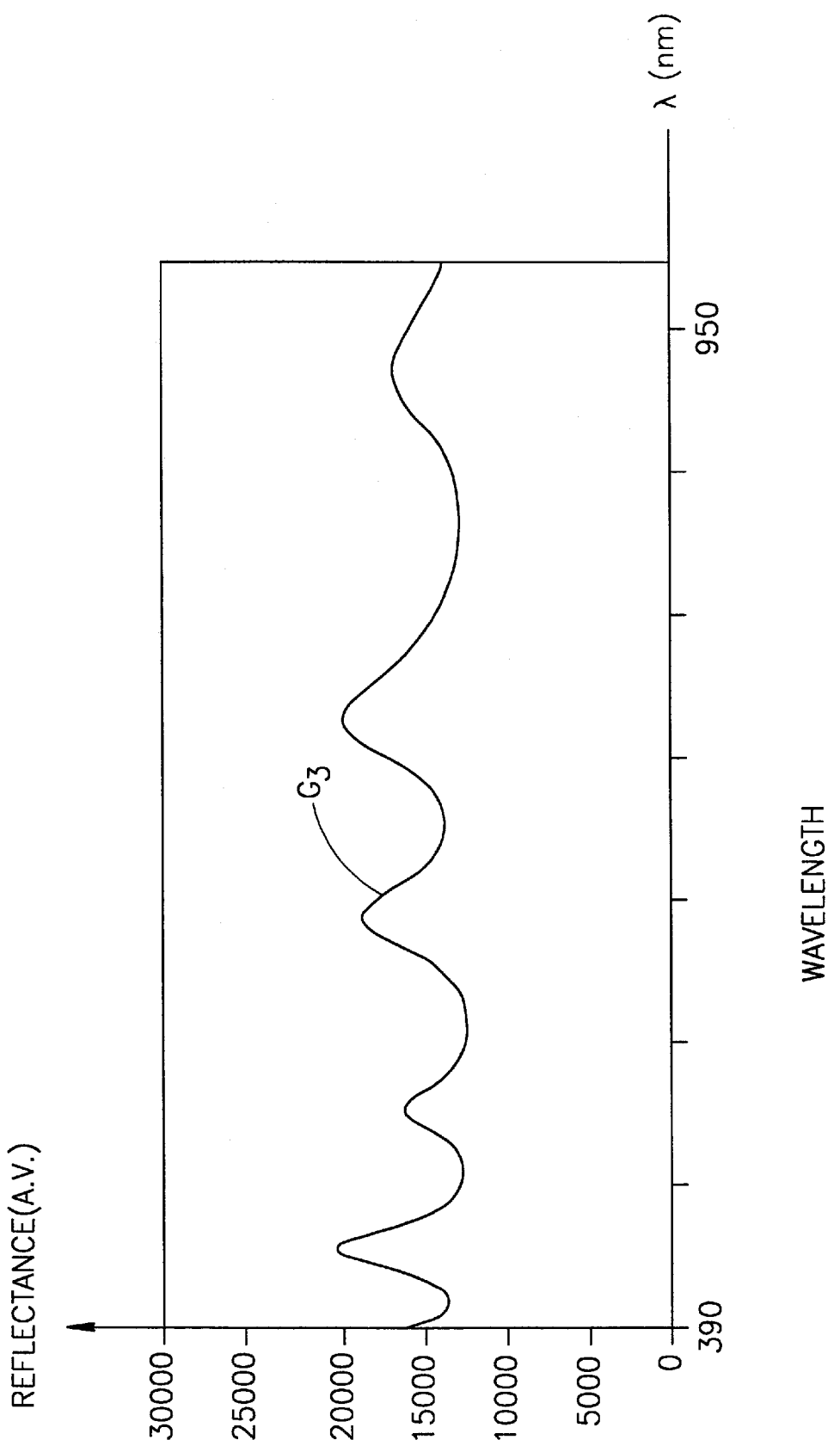

When using a spectrophotometer, changes in the obtained spectrum are indicative of the residues. FIGS. 7A to 7C illustrate three graphs (spectrums) $G_1$, $G_2$ and $G_3$, respectively. Graph $G_1$ corresponds to the typical dual Daemascene field (i.e., without residues), graph $G_2$ corresponds to the same field with 20A Ta residues, and graph $G_3$ presents the situation for the same field with 300A Ta residues. These graphs present theoretical data obtained by computer simulation of the operation of the polishing assembly 60. It is clear that the larger the residues' thickness, the sharper the spectrum difference ($G_3$) from the typical one having no residues at all ($G_1$).

Figure 8A:
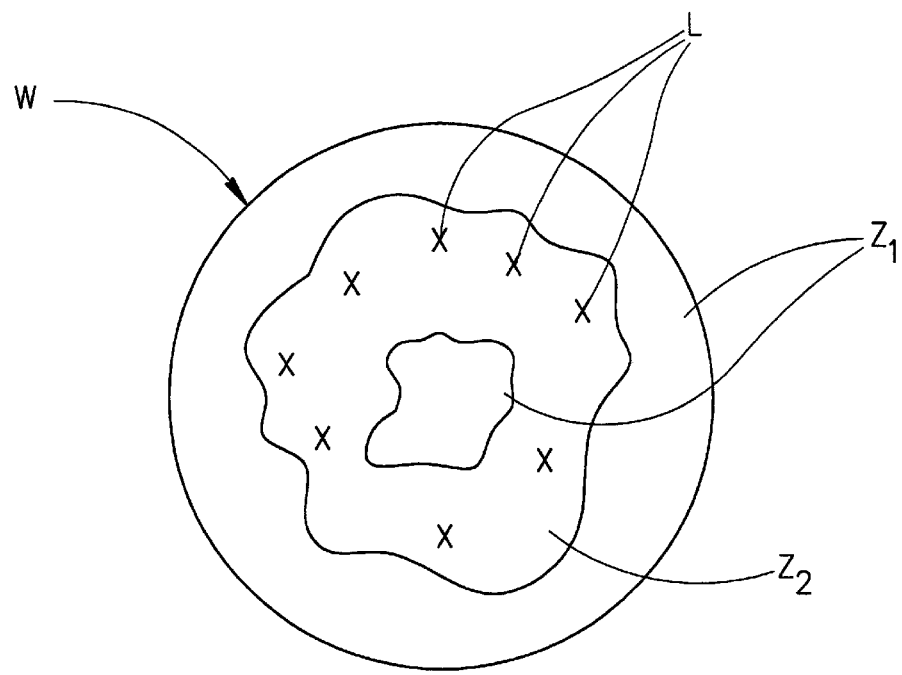
FIG. 8A illustrates a "global residues map" of a copper-based wafer.

Step B: A so-called "global residues map" (as shown in FIG. 8A) including zones of continuous residues $Z_1$ and a zone of limited residues $Z_2$ ("flakes") is constructed. The zones of continuous residues $Z_1$, which are typically located along a periphery circumferential region of the wafer W and within a central region of the wafer, define the zone of limited residues $Z_2$ therebetween.

Step C: Within the zone of limited residues $Z_2$ multiple dies (locations) L are selected in different, spaced-apart areas where polishing gradient have different directions.

Figure 8B:
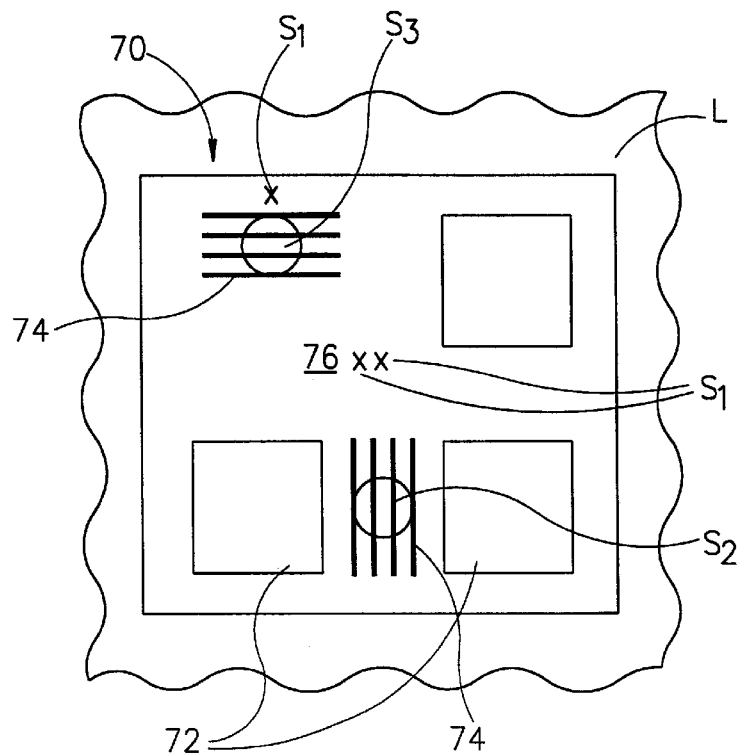
FIG. 8B schematically illustrates a map of the wafer's die.

Step D: Selected dies are scanned with high resolution imaging or probing to choose measuring sites within the die. FIG. 8B schematically illustrates a simplified and "not to scale" map of a die 70 located within one of the selected locations L. The die 70 contains various features, such as copper pads 72, patterned structures 74 and ILD 76. As shown, the patterned structure 74 includes intermittent regions of the copper and ILD. This map serves for the following.

It is known in the art that, when applying a CMP polisher to a wafer, the polishing rate is not equal within the wafer's die, but depends, among other things, on the specific feature within the die under polishing. Based on such information, those features in the die 70, on which a polishing rate is smaller than a predetermined value, or "suspicious" features according to their material type or post polish shape, should be selected as potential locations in which residues are likely to be formed. These are the locations to which measurements should be applied. Sites, generally at $S_1$, where copper or diffusion barrier layer residues are likely to remain after the CMP process, are typically located within the ILD region 76, a so-called "field" or within regions where the lower layers have a concave topography caused by erosion/dishing effects produced during the manufacture of these layers. It should be noted that the measurement sites could be chosen according to the information supplied by a manufacturer, or obtained through previous measurements, for example in the above-indicated case of lower layers having erosion/dishing, as will be described more specifically flyer below.

Step E: Detected residues could be verified by additional inspection of the same dies (either predefined or determined during the recipe preparation) on a slightly under-polished wafer (as compared to that considered in step A) or on a polished-to-target wafer. Alternatively, or additionally, thickness measurements could be applied to the same dies, the thickest sites being considered as those having residues-related effects.

It is understood that, if the product dependent information is known and the process is variable, i.e., case (2) above, the above steps A and B should be carried out to select measuring dies (locations). If the measuring locations are defined and the sites within these locations have to be selected case (3) above, the above steps C, D and E should be performed. The map of "suspicious" locations for residues is constructed in accordance with a predetermined threshold.

Erosion/Dishing

Following are the main operational steps in the recipe preparation process for selecting "suspicious" locations for erosion and/or dishing.

Step I: An over-polished or polished-to-target wafer is provided, and patterned structures within the dies are determined as measuring sites. For this purpose, High Resolution Optical Inspection or scatterometry could be used to identify sites with a suitable geometry. It is obvious that if no erosion/dishing occurs at specific locations on the over-polished wafer, there definitely will be no erosion in these specific locations on the normally polished wafer.

Step II: Dies, for example those located in areas where the polishing rate is greatest are selected as measuring locations, and sites within dies are measured. The determination of the most typical measuring sites within the die where erosion/dishing occur is based on the following. Sites with minimal pitch and maximal filling factor are usually characterized by erosion effect, while sites with the maximal line width are characterized by dishing effect. For example, NovaScan Measurement System performing the measuring technique disclosed in U.S. patent application Ser. No. 09/267,989, assigned to the assignee of the present application, can be used.

Turning back to FIG. 8B, sites $S_2$ and $S_3$ of potential erosion and/or dishing are within the patterned structures 74, namely in metal-containing regions between ILD regions, where the erosion and/or dishing condition is likely to develop.

Measurement

Residues

Having prepared the map of "suspicious" sites for residues, erosion and/or dishing, these suspicious sites are measured by the measurement system 66 (FIG. 5). In other words, when the recipe is already prepared, measurements are applied to the selected sites (features) within the selected locations (dies).

The measurement step is aimed at measuring the layers' thickness and/or their optical constants, in order to verify whether they are regions containing detrimental effects or not. The processed results are compared to predetermined values (e.g., expected values). According to the comparison results, the operational parameters of the polishing assembly 60 are, if required, adjusted for the next wafer to be polished, or for the next stage of multi-stage polishing of the same wafer. Thus, when the wafer W arrives to the measurement system 66, a calibration procedure is optionally performed, and after aligning and positioning the optical means relative to the wafer W, measurements are carried out.

If the measurement system 66 is designed for integrated monitoring, it is usual that the optical means of the system moves towards the selected location of the stationary positioned wafer. One possible example of a method for the wafer alignment based on the features of a pattern is disclosed in U.S. Pat. Nos. 5,682,242 and 5,867,590, both assigned to the assignee of the present application.

Generally speaking, in each selected die (constituting the selected location L), various pre-determined sites are measured for their thickness and/or optical constants. Consequentially, they can be identified for their material type, and a map of real residues is prepared based on these results. As far as the layers in each measuring site are semi-transparent their thickness can be determined. This can also be the case when a metal layer is thin enough, such as a 100A copper layer. In We case of an opaque layer (e.g., thick metal layer), its optical constant can be determined by light reflected from its surface.

The map of the presence of residues could be prepared using several standard image processing techniques, for example, that based on the comparison of data representative of images of the selected locations to that of the stored images (i.e., reference data), in order to detect real residues on the wafer. This comparison is aimed at identifying whether the measured data (i.e., acquired images) contains features which are not found in the stored image, or does not contain features presented in the reference data (stored image). This is the so-called die-to-database inspection technique. To perform the comparison, correlation functions or other pattern recognition methods known in the art can be used, such as that disclosed in the above-mentioned U.S. Pat. Nos. 5,682,242 and 5,867,590. When using correlation functions, the correlation factor(s) is predetermined, being based on the specific application, wafer layers, wafer structure, etc. A change in the measured correlation factor(s) relative to the predetermined one(s) may indicate the absence or existence of residues, depending, respectively, on the fact that the measured data contains features which are not found in the stored image, or does not contain features of the reference data.

It is important to note that the case may be such that no residues appear in a measurement site (through the spectrophotometer measurements), whilst this site has been defined as the potential residues-containing site (either during the recipe preparation or according to the information provided by a manufacturer). This is typical for relatively small, point-like residues. The measurement system 66 includes the microscope-based spectrophotometer and the CCD-based imaging system, the spectrophotometric detector and CCD1 having substantially overlapping fields of view. Practically, the field of view of the spectrophotometric detector is located in the central small region (e.g., 20 $\mu$m) of the field of view of the CCD (e.g., 500×500 $\mu$m). This is implemented by the use of a pinhole in the optical path of the collected light. As indicated above, such a measurement system is disclosed in the U.S. patent application Ser. No. 08/497,382 assigned to the assignee of the present application, which is therefore incorporated herein by reference with respect to this specific example. Hence, the field of view of the CCD actually presents a frame having the measurement site in its center. The spectrophotometric measurement applied to the central region may indicate that the measurement site does not contain residues, while the imaging system that performs the image processing technique locates the residues in the vicinity of the measurement site within this frame. In this case, by displacing the frame (i.e., its center), the measurement could be applied to the real residues-containing point. Alternatively, the image processing can be performed prior to the spectrophotometric measurements.

In the case when the information regarding the stack layer of a specific wafer is not provided by the manufacturer, this information can be obtained during the recipe preparation that includes the preliminary optical measurements. Consequently, when having to move to a site other than that defined in the recipe, one probably will deal wit a different layer structure. In this case, the layer structure has to be determined during the measurement in that specific site. This may, for example, be implemented by a fitting procedure based on reference data containing a library of various typical stack layers structures.

Dishing/Erosion

Figure 9:
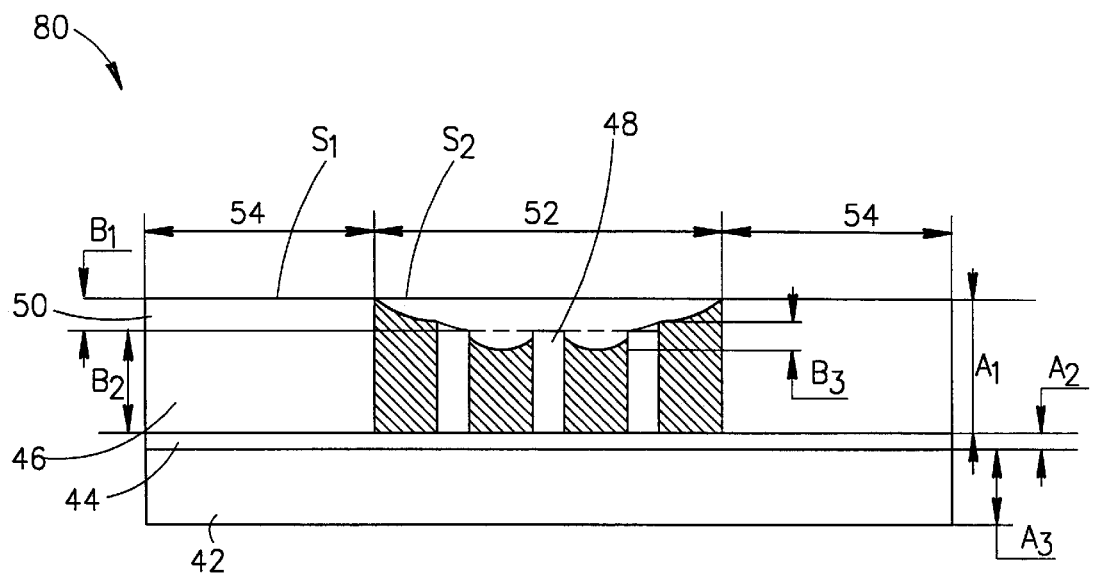
FIG. 9 schematically illustrates the structure of a selected die, showing the main principles of the measurements according to the invention.

Regarding the dishing and erosion effects, the measurements are based on the following. Dishing and erosion measurements are tightly related. Therefore, the measuring site is practically composed of two predetermined locations for the measurements of various parameters. Referring to FIG. 9, there is illustrated a selected die 80 of the wafer W presenting a structure similar to the structure 40 in FIG. 4B. Consequently, same reference numbers are used for identifying the common components in the structures 40 and 80. The structure 80 includes the ILD stack layers within the dense pattern region 52 surrounded by thick ILD layer regions 54.

By applying the measurement system 66 to a first site $S_1$ located within the field region 54, parameters $A_1$, $A_2$ and $A_3$ are measured, corresponding to the thickness of, respectively, layer 42, "etch stop" layer 44 (e.g., SiN), and ILD layer 46. Further thickness measurements are applied to a second measuring site $S_2$ located in the pattern region 52, and thickness value $B_2$ is measured, Erosion is characterized by a thickness parameter $B_1$, which is determined as the difference between the measured values for $A_1$ and $B_2$, i.e., $B_1=A_1-B_2$.

Figure 10:
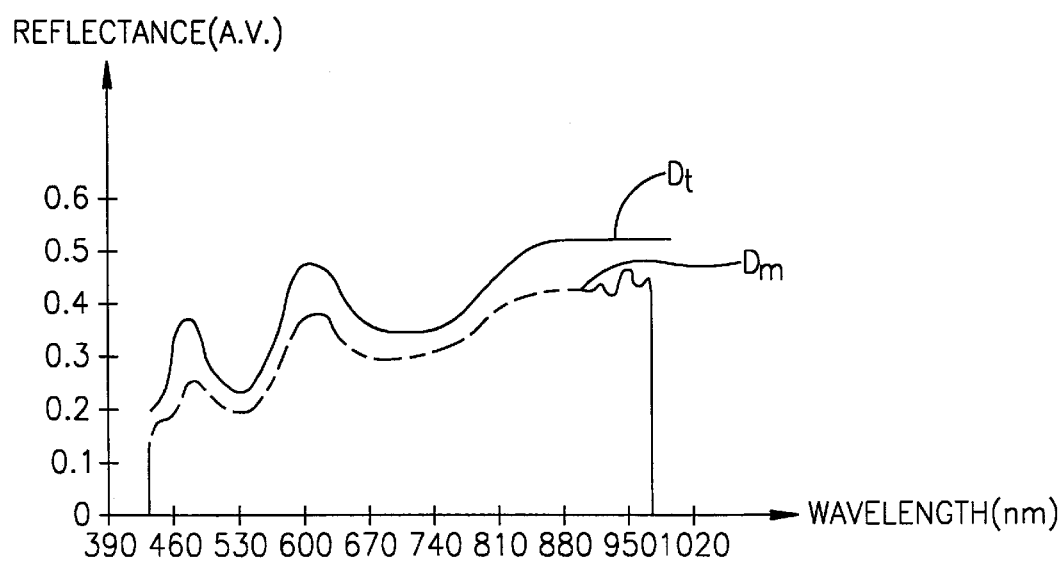
FIG. 10 is a schematic illustration of measured and theoretical spectrums, showing the main principles of an optical model utilized in the present invention.

More specifically, the system 66 measures the photometric intensities of different wavelengths contained in the detected, zero-order light component of light reflected from the measuring area. This measured data is graphically illustrated in FIG. 10, being shown as a dashed curve $D_m$. As indicated above, the processor unit 67 is pre-programmed by the optical model capable of producing theoretical data representative of the photometric intensities of different wavelengths, shown as a solid curve $D_t$ in FIG. 10. By performing a fitting procedure between the measured and theoretical data, the optical model is opted and the thickness parameters are calculated.

It should be noted that the sites $S_1$ and $S_2$ should preferably be located close to each other. Turning back to FIGS. 8B and 9, the locations $S_1$ and $S_2$ to be measured are, respectively, the sites $S_1$ and $S_3$ disposed close to each other. This will enable to more accurately assume that the layers in site $S_2$, i.e., within the region 52, have dimensions substantially identical to those of its neighboring site $S_1$ within the region 54.

Figure 11:
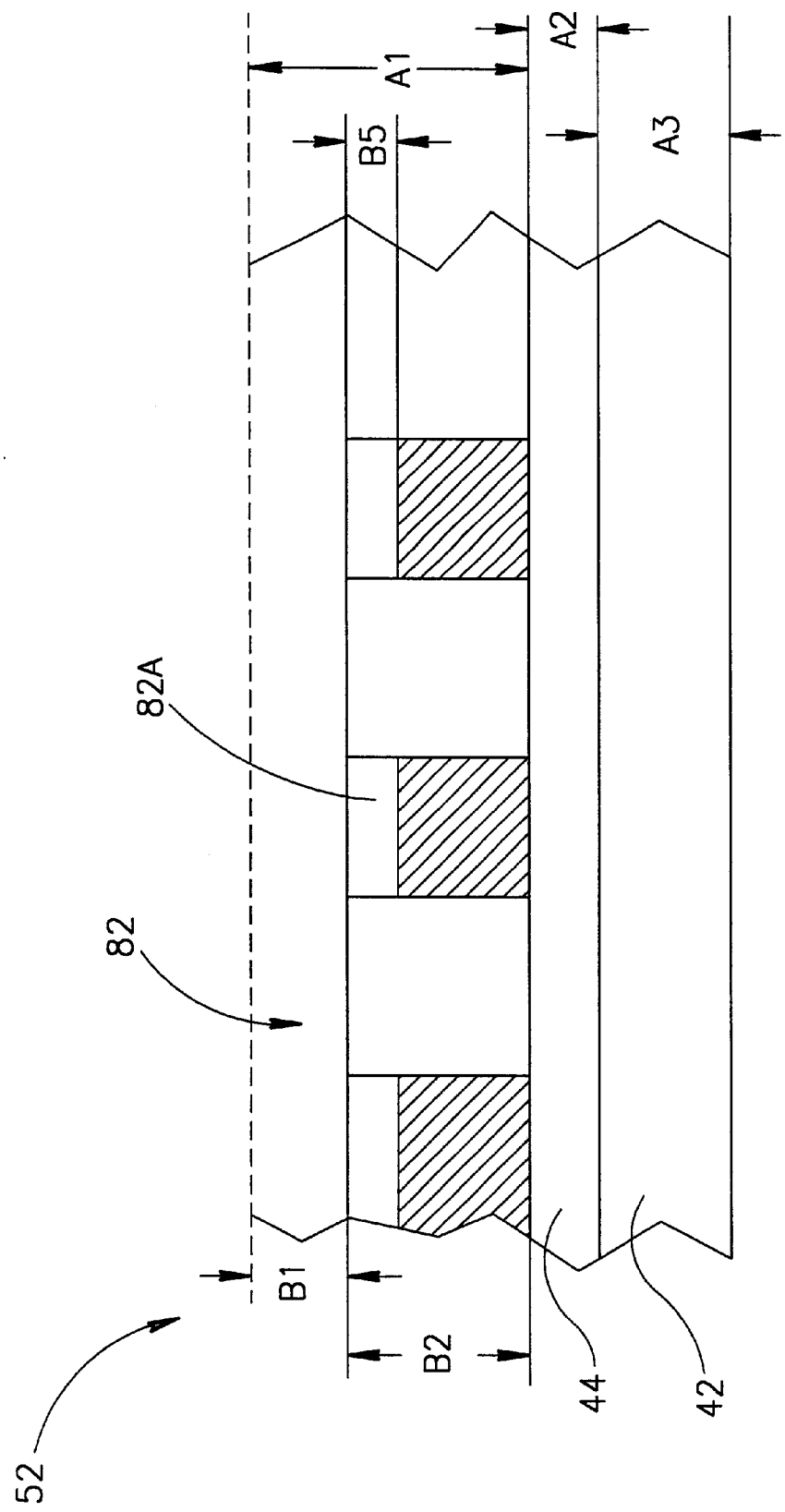
FIG. 11 illustrates the patterned region of the structure of FIG. 9, showing some more principles of the optical model utilized in the present invention.

Dishing (i.e., copper losses) is characterized by a parameter $B_3$. To measure this parameter, the following model is considered. FIG. 11 partly illustrates the patterned region 52 of the structure 80, wherein the existence of an additional layer 82 formed by ambient media (air or water) is assumed, wherein regions 82A of this layer 82 present the dishing condition. The optical model is capable of determining theoretical data representative of the spectrum in such an ambient-layer (air or water) containing structure.

Figure 12:
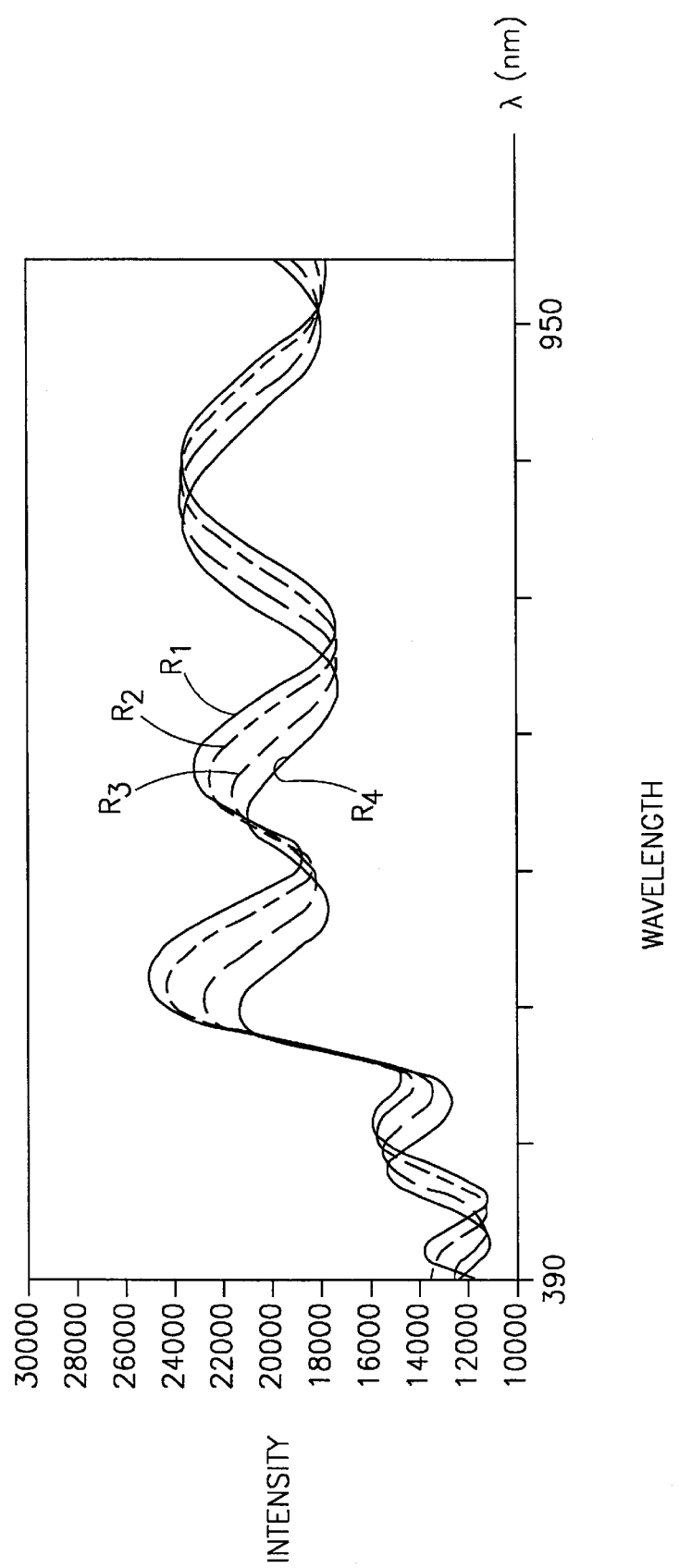
FIG. 12 graphically illustrates three different dishing conditions obtained by a simulation procedure.

FIG. 12 illustrates simulation results in the form of four graphs $R_1$–$R_4$ corresponding, respectively, to the following conditions: (1) the absence of a dishing condition, (2) 200A dishing condition, (3) 500A dishing condition and (4) 750A dishing condition.

It should be specifically noted that the above-described measurements could be applied either to a patterned, die-containing area of the wafer, or to a test site provided at a marginal area of the wafer.

The advantages of the present invention are thus self-evident. The detection of copper and diffusion barrier layer residues, on the one hand, and the dishing and erosion conditions, on the other hand, enable the tight control of the entire CMP process. The well-optimized and controlled (dual) Damascene Copper process should enable the operation within a window of no residues and minimal dishing/erosion conditions. Should process excursions occur, the present invention enables the correction of polishing time to compensate for simple variations. In addition, the present invention enables to completely stop the process in cases where both residues and deep dishing are simultaneously present, i.e., when a drastic CMP or Copper deposition disturbance has occurred. If the spectrophotometer-based measurement system 66 is used for the recipe preparation of the residues map, the ILD and metal losses can be concurrently measured during this step. In other words, the detection of residues and/or dishing/erosion can be carried out simultaneously in the same recipe, or separately to increase the number of sampled dies for each case so as to enhance the control for the user's specific application. The determined metal and ILD losses can be used to correct the operational parameters of the polishing assembly 60 for a next wafer to be polished or for the next stage of multi-stage polishing of the same wafer, and thereby establish a feedback closed-loop control.

Obviously, many modifications and variations of the present invention are possible in the light of the above teachings. For example, in two-step polishing process, residues and dishing measurements can be used after completing the first step of metal polishing but before the second step of oxide polishing. In this case, the erosion measurement is performed after completing the oxide polishing.

Those skilled in the art will readily appreciate that many modifications and changes may be applied to the invention as hereinbefore exemplified without departing from its scope, as defined in and by the appended claims.

What is claimed is:

1. A method for optical control of the quality of a process of chemical mechanical planarization (CMP) performed by a polishing tool applied to an article by detecting whether there exists at least one of, erosion and dishing effects on the article caused by the CMP process, wherein the article has a patterned area which contains a plurality of stacks each formed by a plurality of different layers, the surface of the processed article having at least one pattern in the form of spaced-apart metal regions separated by non-metal regions, the method comprising the steps of:

(a) selecting at least one predetermined measurement site within the patterned area of the article;

(b) illuminating said at least one predetermined measurement site in the article with incident radiation of a preset substantially wide wavelength range;

(c) detecting spectral characteristics of light components reflected from the at least one illuminated site of the article, and generating data representative thereof; and (d) analyzing said data for determining a thickness of at least one layer of the article within said at least one illuminated site to determine whether the thickness value is indicative of the existence of at least one of erosion and dishing effects being thereby indicative of the quality of the CMP process applied to the article, the analysis of said data utilizing a proper optical model based on at least some features of the article and operable to determine data representative of photometric intensities of light components of different wavelengths reflected from the article.

2. The method according to claim 1, wherein said at least one predetermined site is selected in accordance with information provided by a manufacturer of the article.

3. The method according to claim 1, and comprising the further steps of:

illuminating at least one additional site on the article spatially separated from said at least one predetermined site and located in the vicinity thereof;

detecting spectral characteristics of light reflected from the at least one additional illuminated site, and generating data representative thereof; and analyzing said data for determining at least one parameter of the article within said at least one additional illuminated site, said parameter being indicative of the at least one of the erosion and dishing effects.

4. The method according to claim 3, wherein said at least one additional site is selected to include a non-metal region, while said at least one predetermined site is selected to include a metal region.

5. The method according to claim 3, wherein said analyzing of the data comprises the steps of:

determining a first thickness of at least one layer of the article within said at least one predetermined site;

determining a second thickness of at least one layer of the article within said at least one additional site; and;

determining a difference between the first and second thicknesses corresponding to at least one of the erosion and dishing effects within said at least one predetermined site.

6. The method according to claim 1, wherein said optical model utilizes the existence of an additional, ambient layer above the metal region, in which the dishing effect exists.

7. The method according to claim 1, wherein said selecting of the at least one predetermined site comprises the step of:

performing preliminary monitoring by applying steps (b) to (d) to a test article constructed similar to said article under CMP, but being at least slightly over-polished, said at least one predetermined site being that where the erosion effect is detected.

8. The method according to the claim 7, further comprising the steps of:

illuminating at least one additional site in the article spatially separated from said at least one predetermined site and located in the vicinity thereof;

detecting spectral characteristics of light from the at least one additional illuminated site, and generating data representative thereof; and analyzing said data for determining at least one parameter of the article within said at least one additional illuminated site, said parameter being indicative of the erosion effect.

9. The method according to claim 1, wherein said selecting of the at least one predetermined site comprises the step of:

performing preliminary monitoring by applying steps (b) to (d) to a test article constructed similar to said article under the CMP process, but being at least slightly over-polished, said at least one predetermined location being that where the dishing effect is detected.

10. The method according to claim 9, further comprising the steps of:

illuminating at least one additional site on the article spatially separated from said at least one predetermined site and located in the vicinity thereof;

detecting spectral characteristics of light reflected from the at least one additional illuminated site, and generating data representative thereof; and analyzing said data for determining at least one parameter of the article within said at least one additional illuminated site, said parameter being indicative of the dishing effect.

11. A monitoring system for optical control of the quality of a process of chemical mechanical planarization (CMP) performed by a polishing tool applied to an article containing a plurality of stacks each formed by a plurality of different layers, the surface of the processed article having at least one patterned area in the form of spaced-apart metal regions separated by non-metal regions, the system comprising:

a spectrophotometer for applying to the processes article to illuminate at least one site within the patterned area by incident radiation of a preset substantially wide wavelength range detect light reflected from the illuminated site and provide measured data representative of photometric intensities of detected light within said wavelength range;

an imaging arrangement capable of acquiring images formed by light reflected from the article; and a processor unit coupled to the spectrophotometer and to the imaging arrangement, the processor unit comprising a pattern recognition software for analyzing the acquired image to locate measurements, the processor unit being operable to apply a proper optical model based on at least some features of the article for providing theoretical data representative of photometric intensities of light reflected from the article within said wavelength range and utilizing the measured data to calculate at least a thickness if at least one layer of the article within said at least one site, the calculated value being indicative of whether there exists at least one of erosion and dishing effects in the illuminated site, being thereby indicative of the quality of the CMP process applied to the article.

12. The system according to claim 11, wherein said system is an integrated system with a production line for manufacturing said articles.

13. A production line for manufacturing articles containing a plurality of stacks each formed by a plurality of different layers, the production line comprising a polisher to be applied to said article for performing a chemical mechanical planarization (CMP) of an uppermost layer of the article thereby defining at least one surface pattern in form of spaced-apart metal regions separated by non-metal regions, and an optical monitoring system for determining the existence of at least one of erosion and dishing effects on the article caused by the CMP process, the system comprising:
- a spectrophotometer for applying to the processed article to illuminate at least one site within the patterned area by incident radiation of a preset substantially wide wavelength range and detect light reflected from the illuminated site for providing measured data representative of photometric intensities of detected light within said wavelength range;
- an imaging arrangement operable to acquire images formed by light reflected from the article; and a processor unit coupled to the spectrophotometer, the processor unit comprising a pattern recognition software for analyzing the acquired image to locate measurements, the processor unit being operable to apply an optical model based on at least some features of the article for providing theoretical data representative of photometric intensities of light reflected from the article within said wavelength range and utilizing the measured data to calculated at least a thickness of at least one layer of the article within said at least one site, the calculated value being indicative of whether there exists at least one of erosion and dishing effects in the illuminated site, being thereby indicative of the quality of the CMP process.

* * * * *